US012687966B2

(12) United States Patent
Das et al.

(10) Patent No.: US 12,687,966 B2
(45) Date of Patent: Jul. 21, 2026

(54) ADJUSTED PROGRAMMING ASSOCIATED WITH READ ERRORS

(71) Applicant: Microchip Technology Incorporated, Chandler, AZ (US)

(72) Inventors: Saswati Das, Milpitas, CA (US); Nian Niles Yang, Mountain View, CA (US); Srinivas Yelisetti, Fremont, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 19/041,987

(22) Filed: Jan. 30, 2025

(65) Prior Publication Data

US 2025/0348223 A1 Nov. 13, 2025

Related U.S. Application Data

(60) Provisional application No. 63/644,499, filed on May 8, 2024.

(51) Int. Cl.
| | |
|---|---|
| *G06F 12/00* | (2006.01) |
| *G06F 3/06* | (2006.01) |
| *G11C 16/10* | (2006.01) |
| *G11C 16/26* | (2006.01) |
| *G11C 16/34* | (2006.01) |

(52) U.S. Cl.
CPC .......... *G06F 3/0614* (2013.01); *G06F 3/0659* (2013.01); *G06F 3/0679* (2013.01); *G11C 16/10* (2013.01); *G11C 16/26* (2013.01); *G11C 16/3459* (2013.01)

(58) Field of Classification Search
CPC .... G06F 3/0614; G06F 3/0659; G06F 3/0679; G06F 12/0238; G06F 11/07; G11C 16/10; G11C 16/26; G11C 16/3459; G11C 11/5642
See application file for complete search history.

(56) References Cited

U.S. PATENT DOCUMENTS

| | | | |
|---|---|---|---|
| 2012/0311402 A1* | 12/2012 | Tseng .................. | H03M 13/612 |
| | | | 714/763 |
| 2014/0281119 A1* | 9/2014 | Hyun .................. | G06F 12/0646 |
| | | | 711/102 |
| 2020/0265910 A1 | 8/2020 | Steiner et al. | |
| 2021/0134378 A1 | 5/2021 | Papandreou et al. | |
| 2022/0155956 A1 | 5/2022 | Rayaprolu et al. | |
| 2023/0101414 A1* | 3/2023 | Hassner .................. | G11C 29/52 |
| | | | 714/764 |
| 2024/0377972 A1* | 11/2024 | Chen ..................... | G06F 3/0679 |

OTHER PUBLICATIONS

International Search Report and Written Opinion, PCT/US2025/028212, mailed Aug. 22, 2025, 11 pages.

* cited by examiner

*Primary Examiner* — Shawn X Gu
(74) *Attorney, Agent, or Firm* — Hovey Williams LLP

(57) ABSTRACT

In some implementations, a storage device may perform a read operation using a first read voltage. The storage device may identify a read error associated with the read operation. The storage device may identify a difference between the first read voltage and a second read voltage, the second read voltage associated with a reduced raw bit error rate (RBER). The storage device may perform a write operation using a program verify voltage that is based on the difference.

20 Claims, 9 Drawing Sheets

510 Perform a read operation using a first read voltage

520 Identify a read error associated with the read operation

530 Identify a difference between the first read voltage and a second read voltage, the second read voltage associated with a reduced raw bit error rate (RBER)

540 Perform a write operation using a program verify voltage that is based on the difference

100

106
Provide instructions for a read operation associated with data

108
Perform a read operation on the block using a read voltage

110
Identify a read error associated with the read operation

Controller associated with storage medium
102

Block of storage medium
104

100

112
Perform error correction associated with the read error

Block of storage medium
104

114
Identify a difference between the first read voltage and an adjusted read voltage with a reduced RBER 116
Store an indication of the difference within metadata of a virtual block Controller associated with storage medium
102

100

118
Provide instructions for a write operation

120
Perform the write operation at the block using an adjusted program voltage

122
Perform program verify using an adjusted program verify voltage

Controller associated with storage medium
102

Block of storage medium
104

500

510 — Perform a read operation using a first read voltage

520 — Identify a read error associated with the read operation

530 — Identify a difference between the first read voltage and a second read voltage, the second read voltage associated with a reduced raw bit error rate (RBER)

540 — Perform a write operation using a program verify voltage that is based on the difference

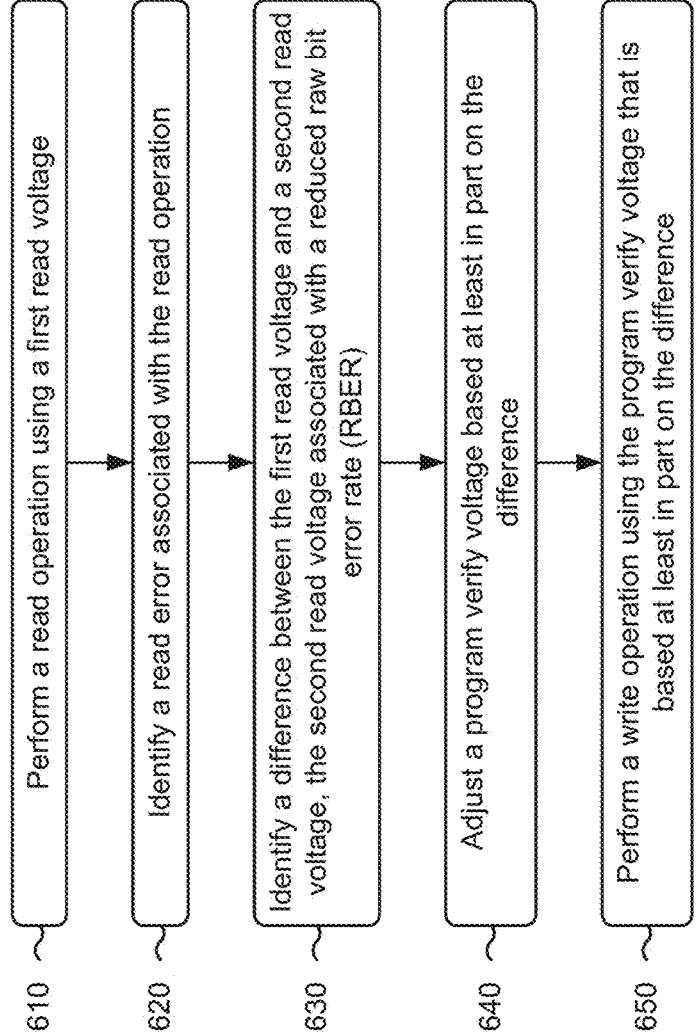

610 — Perform a read operation using a first read voltage

620 — Identify a read error associated with the read operation

630 — Identify a difference between the first read voltage and a second read voltage, the second read voltage associated with a reduced raw bit error rate (RBER)

640 — Adjust a program verify voltage based at least in part on the difference

650 — Perform a write operation using the program verify voltage that is based at least in part on the difference

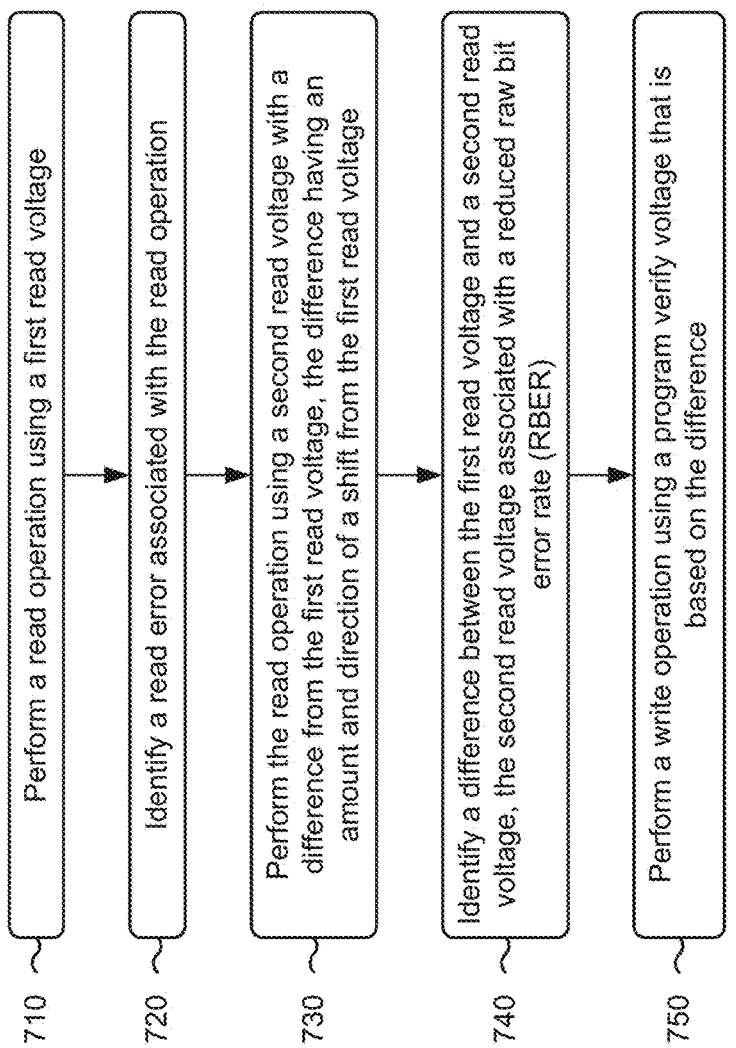

700

710 Perform a read operation using a first read voltage

720 Identify a read error associated with the read operation

730 Perform the read operation using a second read voltage with a difference from the first read voltage, the difference having an amount and direction of a shift from the first read voltage 740 Identify a difference between the first read voltage and a second read voltage, the second read voltage associated with a reduced raw bit error rate (RBER)

750 Perform a write operation using a program verify voltage that is based on the difference

FIG. 7

ADJUSTED PROGRAMMING ASSOCIATED WITH READ ERRORS

CROSS-REFERENCE TO RELATED APPLICATION

This Patent Application claims priority to Provisional Patent Application No. 63/644,499, filed on May 8, 2024, and entitled "ADJUSTED PROGRAMMING ASSOCI-ATED WITH PRIOR READ ERRORS." The disclosure of the prior Application is considered part of and is incorporated by reference into this Patent Application.

FIELD

The present disclosure generally relates to operations performed at a storage device. A controller of the storage device may attempt to read or write data to one or more components of the storage device. However, errors may be present when attempting to read the data. The present disclosure further relates to error correction and adjusting a program voltage or a program verify level based on a prior error correction.

BACKGROUND

A non-volatile memory device may include a storage device that may store and retain data without external power supply. One example of a storage device is a not-and (NAND) flash memory device.

A virtual block (VB) is a collection of blocks (e.g., memory blocks) across all logical unit numbers (LUNs). A VB has a size that varies according to number of bad blocks. For example, if no bad blocks, the size=(#Channels)×(#Targets)×(#LUNs)×(Physical Block Size). The VB includes multiple virtual pages. A virtual page is a collection of pages across all LUNs in a VB. A virtual page is a redundant array of independent disks (RAID) stripe which contains one or two exclusive OR (XOR) parity pages. The number of virtual pages in a VB is equal to the number of pages of a single block.

Similarly, a virtual word line is a collection of word lines across all LUNs in a VB. A flash transition layer (FTL) handles NAND blocks in a VB unit. All the word lines in a virtual word line in a VB are written together during programming. The FTL manages a list of VBs according to states (i.e., free, open, closed, reclaim, or bad).

In some examples, the storage device may write data on a page of a VB using a program voltage of the storage device. The storage device may receive a read request from a host device and may attempt to read the data. However, the storage device may read the data with errors. For example, the data may have errors caused during the write operation or errors caused during the read operation. In this case, the controller may perform error correction code (ECC) decoding to a read attempt. In this way, the controller may obtain the stored data even when errors are present. However, repeated error correction may increase latency of the read operation.

If there is an uncorrectable error during a read operation that cannot be recovered using read retry attempts, the storage device may apply a heroic recovery mechanism that significantly reduces read performance and increases read latencies, thereby reducing a quality of service (QoS) of the storage device.

If the data cannot be recovered using the heroic recovery mechanism such as voltage threshold Vth (e.g., read threshold voltage) tracking and low density parity check (LDPC) soft decoding, then the storage device may attempt to recover the erroneous data using RAID recovery. If RAID recovery fails, the storage device may lose user data.

Also, in order to reduce a likelihood of further errors on a block associated with the errors, if any page of a VB has to enter heroic read recovery, the storage device may move all data of the VB to a new VB by triggering priority garbage collection on the entire VB, thereby causing non-uniform read-write performance during a mixed workload.

Additionally, if the heroic recovery fails, the controller may also mark erroneous multi-plane blocks as bad blocks, so that the block is not used any more for storing data. Marking the entire multi-plane block as bad blocks negatively affects an effective overprovisioning of the storage device, resulting in an increase in write amplification, reduced write performance, increased program erase (PE) cycles, and reduced lifetime of the storage device.

SUMMARY

In some implementations, a method performed by a storage device includes performing a read operation using a first read voltage. The method includes identifying a read error associated with the read operation. The method includes identifying a difference between the first read voltage and a second read voltage, the second read voltage associated with a reduced raw bit error rate (RBER). The method includes performing a write operation using a program verify voltage that is based on the difference.

In some implementations, a system comprises a controller of a non-volatile memory device. The controller is to perform a read operation using a first read voltage. The controller is to identify a read error associated with the read operation. The controller is to identify a difference between the first read voltage and a second read voltage, the second read voltage associated with a reduced RBER. The controller is to adjust a program verify voltage based at least in part on the difference. The controller is to perform a write operation using the program verify voltage that is based at least in part on the difference.

In some implementations, a computer program product comprising one or more computer readable storage media and program instructions collectively stored on the one or more computer readable storage media. The program instructions comprise program instructions to perform a read operation using a first read voltage. The program instructions comprise program instructions to identify a read error associated with the read operation. The program instructions comprise program instructions to perform the read operation using a second read voltage with a difference from the first read voltage, the difference having an amount and direction of a shift from the first read voltage. The program instructions comprise program instructions to identify a difference between the first read voltage and a second read voltage, the second read voltage associated with a reduced RBER. The program instructions comprise and program instructions to perform a write operation using a program verify voltage that is based on the difference.

BRIEF DESCRIPTION OF THE DRAWINGS

FIGS. 5-7 are flowcharts of example processes associated with adjusted programming associated with read errors described herein.

DETAILED DESCRIPTION

Figure 1A:
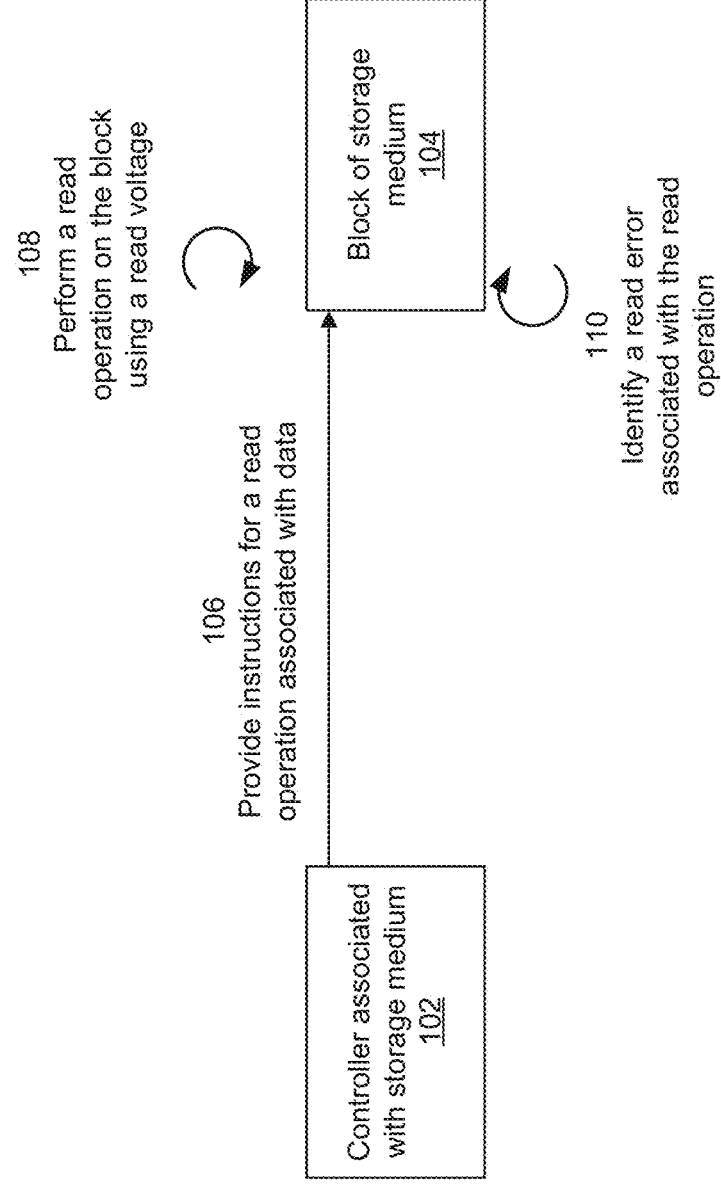
FIGS. 1A-1C are diagrams of an example of adjusted programming associated with read errors described herein.

The following detailed description herein and in the Appendix (incorporated herein in its entirety) of example implementations refers to the accompanying drawings. The same reference numbers in different drawings may identify the same or similar elements.

When performing a write operation, a storage device (e.g., a NAND device or a non-volatile memory device, among other examples) may detect a program error that is associated with a physical error of the storage device at one or more elements, such as a word line.

In some examples, the storage device may attempt a heroic recovery of the data based on errors of the data when performing a read operation. If error correction, such as the heroic recovery, is performed (e.g., successfully or unsuccessfully), the storage device may move all data of an associated virtual block (VB) to another VB and mark blocks of the VB as bad blocks to be avoided for future write operations. In this way, the storage device may have reduced capacity (e.g., associated with effective overprovisioning of the drive resulting in an increase in write amplification), reduced write performance, increased program erase (PE) cycles, and reduced lifetime of the storage device, among other examples.

In some aspects described herein, a storage device may adjust a program verify level (e.g., voltage) or a program voltage of an erroneous page (e.g., if there are ECC uncorrectable read errors) for a subsequent programming sequence based on a read voltage (e.g., obtained through a read retry or Vth tracking, among other examples) that is associated with a reduced ECC raw bit error rate (RBER). For example, the storage device may adjust the program verify level or the program voltage based at least in part on a read error associated with a previous read operation on the erroneous page, or an error correction operation that identifies an adjustment to a program voltage or a program verify voltage associated with the previous read operation. Through adaptive program verify level and program voltage adjustment (using information associated with errors or error correction of a previous read operation), the storage device may reduce further read errors on the same location, thereby reducing an uncorrectable bit error rate (UBER) rate and improving reliability.

The storage device may adjust the program verify level and program voltage step size during the subsequent programming sequence on the erroneous physical block and LUN, which may reduce a subsequent UBER of the storage device (e.g., at the erroneous physical block) and improve read latency and QoS. For example, the storage device may reduce a likelihood of triggering a read retry or heroic recovery mechanism during a subsequent read at the same location.

By reducing uncorrectable read errors, the storage device may also avoid marking associated multi-plane blocks as bad blocks in the case of uncorrectable read errors. This may conserve effective overprovisioning (OP), thereby reducing write amplification of the drive and reducing a reduction of storage capacity. Additionally, or alternatively, this may improve write performance, conserve program/erase (PE) cycles of the blocks and enhance a lifetime of the storage device.

In some examples, when an ECC uncorrectable read error occurs and triggers a recovery algorithm, such as read retry or a heroic recovery mechanism such as Vth tracking (if needed), the storage device may record associated information. For example, the storage device may store the associated information in a VB information table (e.g., in random access memory associated with the storage device). In some aspects, the associated information may include an indication (e.g., a flag) of an error page (e.g., lower, middle, or upper page), an erroneous LUN number in the VB, or a read voltage (e.g., obtained through either read retry or a Vth tracking algorithm, among other examples) associated with a relatively low RBER (e.g., a lowest RBER as determined in a prior read operation). In some aspects, the read voltage may be indicated with a configured granularity (e.g., 4 or 5 bits or 12.5 millivolts, among other examples). In some aspects, the information may include an indication of an amount and direction of a shift (associated with the relatively low RBER), with the shift being relative to a default read voltage, a current read voltage, or a previously configured read voltage. In some aspects, the associated information may include an indication of an adjusted program voltage for the page.

In some aspects, the storage device may move data from the VB to another block (e.g., a "new" block that is different from the VB having the errors) either due to regular or priority garbage collection. The storage device may cause the erroneous VB to be recycled and reused for a new data write. In some aspects, the storage device may change a program verify voltage level (e.g., from a default program verify voltage level) of a page associated with the error (e.g., on the target LUN in the VB) with a similar amount of shift and sign (e.g., positive or negative direction) as recorded in the VB information table. The changed program verify voltage level may establish a minimum RBER during a subsequent read operation on the page of the VB.

In some aspects, a program condition (e.g., program voltage) on the page and LUN on the VB may also be adaptively modified by adjusting the program voltage step size to accommodate shifted program verify levels.

Figure 1B:
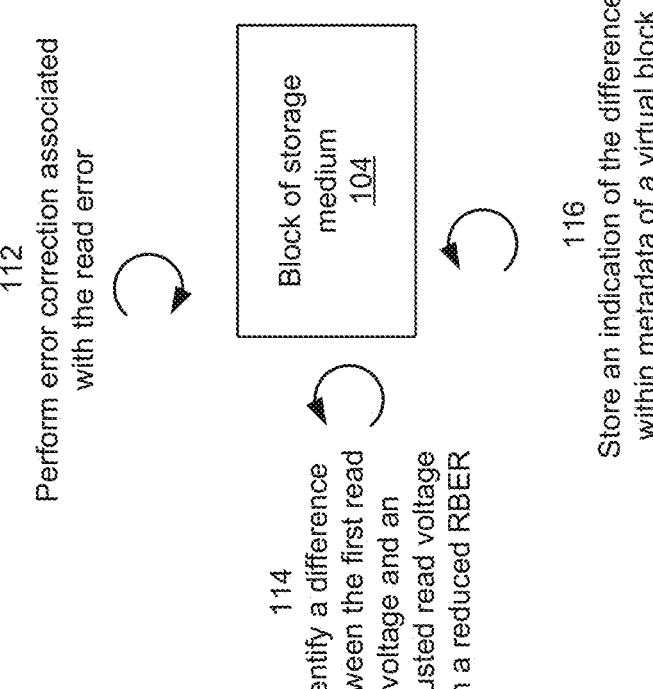
Figure 1C:
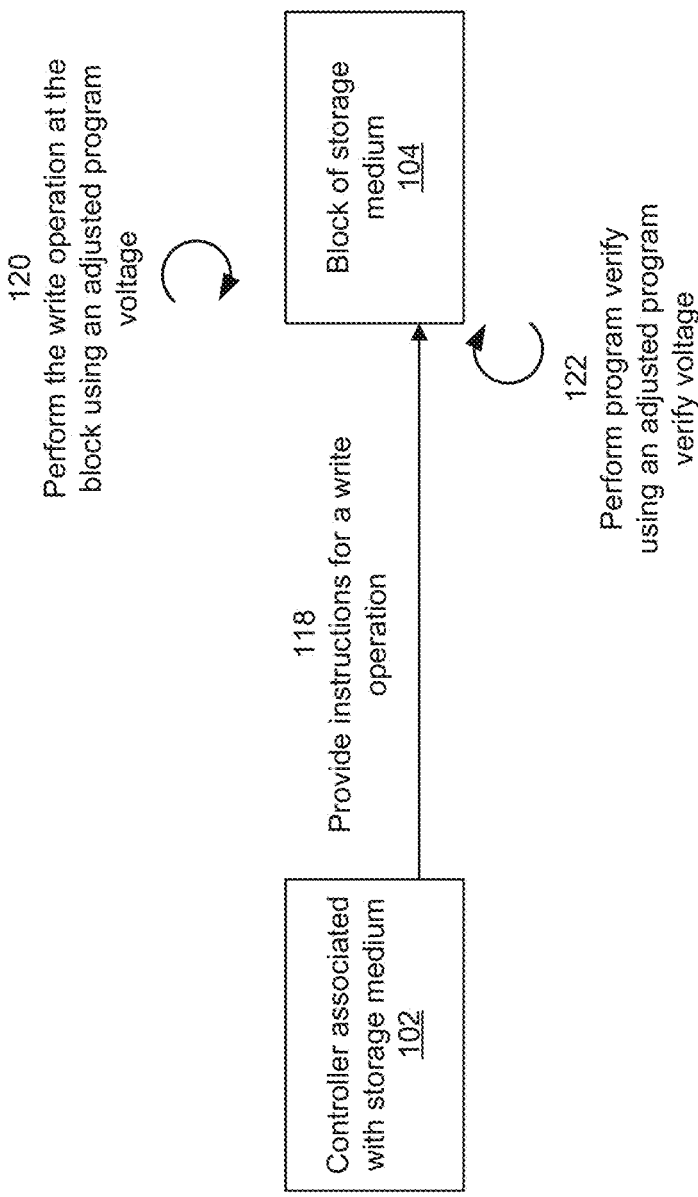

FIGS. 1A-1C are diagrams of an example of adjusted programming associated with read errors described herein. As shown in FIGS. 1A-1C, a controller 102 associated with a storage medium may provide data to a block 104 of a storage medium for programming the data onto the block 104. In some aspects, the controller 102 may be an application specific integrated circuit (ASIC), firmware, or other processor local to the storage medium. In some aspects, the controller 102 may be external to the storage medium (e.g., at the storage device on a system on chip (SOC)). In some aspects, the block 104 of the storage medium may be associated with a virtual block that includes multiple blocks. In some aspects, the block 104 may include multiple LUNs, word lines, and pages associated with physical locations of the block 104.

As shown in FIG. 1A, and by reference number 106, the controller 102 may provide, to the block 104, instructions for a read operation associated with data. In some aspects, the instructions may indicate one or more of a location, or an index associated with the location, of the storage medium that has the data stored thereon and a one or more metrics for reading the data (e.g., a cell level to be used for storage of the data on the block 104, among other examples).

As shown by reference number 108, the storage device (e.g., the controller 102) may perform a read operation on the block 104 using a read voltage. For example, the storage device may use a default read voltage or a previously adjusted read voltage for reading the data from the block 104.

As shown by reference number 110, the storage device (e.g., via the controller 102) may identify a read error associated with the read operation. For example, the storage device may read the physical location associated with the data using a hard bit decoding scheme to read and decode the data from the block 104. The storage device (e.g., the controller 102) may identify one or more errors within the data based at least in part on a parity check scheme or other decoding scheme.

As shown in FIG. 1C, and by reference number 112, the storage device may perform error correction associated with the read error. In some aspects, the storage device may perform error correction as part of a hard bit read and decoding operation, a soft bit read and decoding operation, or a heroic recovery, among other examples. In some aspects, the storage device may perform error correction in association with attempts to read the block 104 using different read voltages.

As shown by reference number 114, the storage device may identify a difference between the first read voltage and an adjusted read voltage with a reduced RBER (e.g., relative to an RBER of the first read voltage). In some aspects, the storage device may determine an amount (e.g., in voltage) of a difference between a default or previously configured read voltage and a read voltage that produced a reduced (e.g., smallest) RBER.

As shown by reference number 116, the storage device may store an indication of the difference within metadata associated with a virtual block that includes the block 104. In some aspects, the difference may be associated with the block 104, a page or logical unit number (LUN) of the block 104, or multiple blocks of the virtual block.

As shown in FIG. 1C, and by reference number 118, the controller 102 may provide instructions for a write operation 118 to the block 104. For example, the storage device may receive additional data to program to the block 104 or may receive an update to data stored at the block 104.

As shown by reference number 120, the storage device may perform the write operation at the block using an adjusted program voltage. The adjusted program voltage may include a modification to a previously used program voltage (e.g., a program voltage used to program the data associated with the read operation of FIGS. 1A-1B), where an amount of the modification and a direction of the modification is based at least in part on the difference between the first read voltage and the adjusted read voltage. For example, the adjusted program voltage may be adjusted by a same magnitude of the difference (or a magnitude that is based at least in part on the magnitude of the difference) and may be in a same direction or an opposite direction (e.g., up or down) as the difference.

As shown by reference number 122, the storage device may perform a program verify on data written in connection with the write operation described in connection with reference numbers 118-120, using an adjusted program verify voltage. Similar to the adjusted program voltage, the adjusted program verify voltage may be adjusted by a same magnitude of the difference (or a magnitude that is based at least in part on the magnitude of the difference) and may be in a same direction or an opposite direction (e.g., up or down) as the difference between the first read voltage and the adjusted read voltage.

In some aspects, the storage device may adjust the program voltage or the program verify voltage in associated with the difference based at least in part on the write operation being instructed for writing at a same virtual block, a same block (block 104), a same page, or a same LUN as the read operation described in connection with FIGS. 1A-1B. In this way, the storage device may use the adjusted program voltage (and program verify voltage) that has been adjusted based at least in part on a read error from a previous read operation performed at the same location (e.g., same virtual block, same block, same page, or same LUN). This may reduce a likelihood of subsequent read errors, reduce an amount of resources used for error correction, or reduce an amount of uncorrectable block errors at the storage medium.

The number and arrangement of components shown in FIG. 1 are provided as an example.

Figure 2:
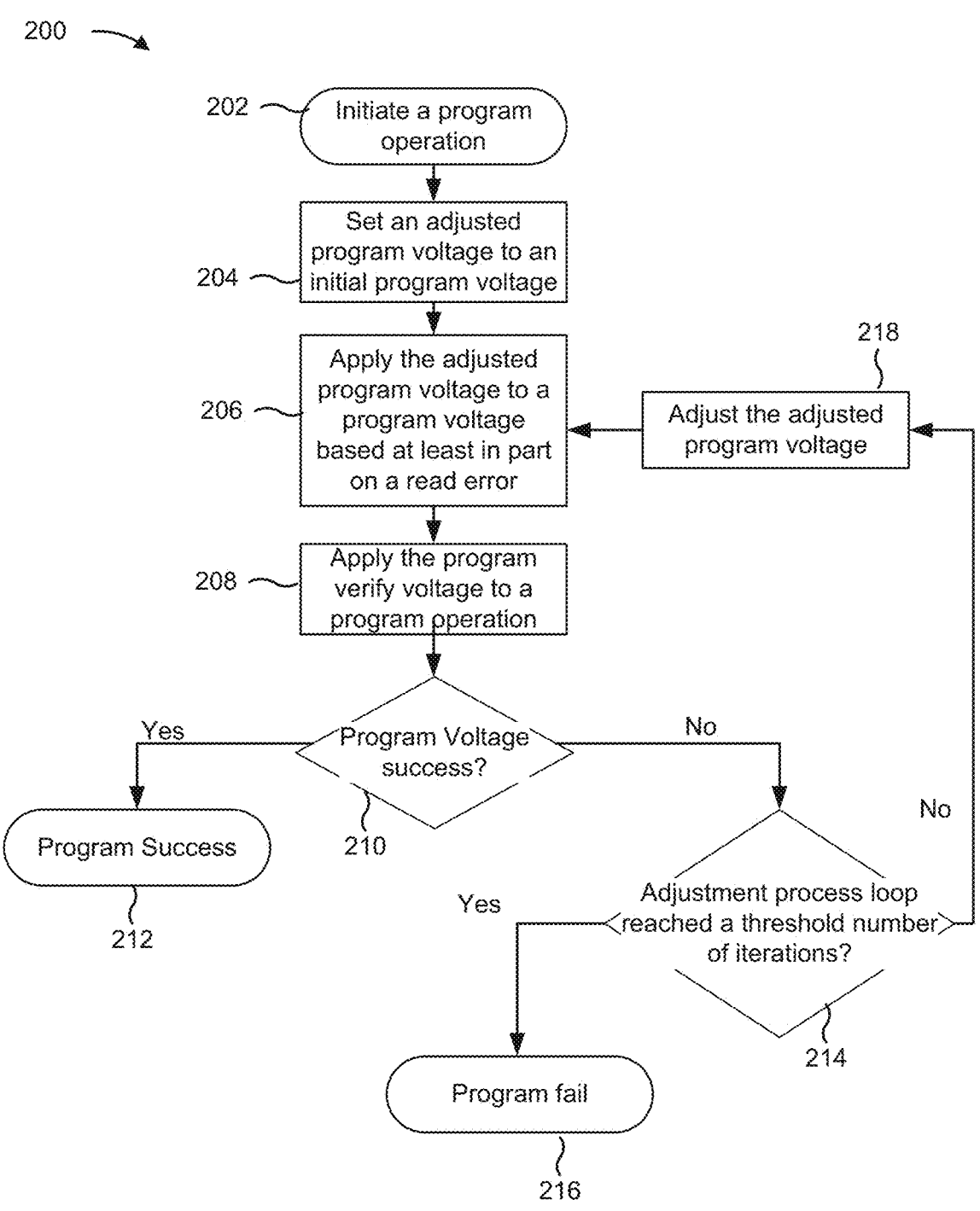
FIG. 2 is a diagram of an example of adjusted programming associated with read errors described herein.

FIG. 2 is a diagram of an example 200 of adjusted programming associated with read errors described herein. The operations described in connection with example 200 may be performed by a storage device, or one or more components of the storage device, such as a controller, among other examples. Although examples may be described in connection with FIG. 2 as an SSD or NAND device, other storage devices are intended to be interchangeable in the context of the described aspects and examples. For example, the storage device may include, or may be included in, a NOR flash memory device, an EEPROM, or another storage device that uses program and program verification operations, among other examples.

As shown in FIG. 2, and by reference number 202, a storage device may initiate a program operation (e.g., a write operation). In some aspects, the storage device may receive a request to perform the program operation from a host device. The program operation may include writing data to a physical location of a storage medium. For example, the program operation may include writing data to a word line or a multiple-block word line (e.g., a super word line). The storage medium may include virtual blocks that include multiple blocks. The multiple blocks may respectively include bit lines in a first dimension and word lines in a second dimension (e.g., using transistors or cells from multiple bit lines).

In some aspects, physical characteristics of the virtual block or blocks may cause a shifting program voltage or stored voltage over time with use of the virtual block or block. For example, as the blocks age, a read voltage may shift based at least in part on increased program/erase cycles, read disturb events, or retention, among other examples.

In some aspects, the storage medium may include a multiple-level cell, such as a double-level cell, a triple-level cell (TLC) or a quad-level cell (QLC). These multiple-level cells may have multiple voltage thresholds associated with different values for the cells. In this case, voltage shifts may cause read errors with increased frequency based at least in part on smaller differences in read voltage values (compared to the voltage thresholds) indicating different cell values.

As shown by reference number 204, the storage device may set an adjusted program voltage (APV to an initial (I=1) program voltage ($V_{ip}$). In some aspects, the initial program voltage may be a factory configured program voltage or a most recently configured program voltage. For example, the $V_{in}$ may be associated with an initial state or default state of the storage medium.

As shown by reference number 206, the APV is applied to the program voltage. For example, a current APV is applied. The storage device (e.g., the storage medium) may program (e.g., write) the data to blocks (e.g., at word lines or pages) of the storage medium, using the APV to identify ranges of voltages to be applied to cells of the storage medium to store values of the data. The current APV may be the initial APV or a most recently used APV, among other examples.

The APV (e.g., other than the initial APV) may be based at least in part on a read error from a previous read operation. For example, in the previous read operation, the storage device may attempt to read data stored during a previous program operation. The storage device may identify one or more errors within the data and may perform error correction. In some aspects, the storage device may adjust a read voltage (e.g., as part of a soft bit read) to assist in the error correction. The storage device may identify an adjusted read voltage that is associated with a reduced error rate (e.g., reduced BER) relative to an initial read voltage. The storage device may identify a difference in voltage between the initial read voltage and the adjusted read voltage and may store an indication of the voltage (e.g., in metadata associated with a location of the data, such as a virtual block, a block, a page, or a LUN, among other examples). The storage device may generate an adjustment from the initial APV or a mode recently used APV, with the adjustment based at least in part on the difference in voltage between the initial read voltage and the adjusted read voltage. For example, the adjustment in the APV may be the same (e.g., within a threshold or with a level of granularity) as the difference in voltage between the initial read voltage and the adjusted read voltage.

As shown by reference number 208, the storage device may apply a program verify voltage (PVV) to the program operation. The PVV may be based on the APV (e.g., which may be in turn based at least in part on the difference in voltage between the initial read voltage and the adjusted read voltage). The PVV may be associated with detection of failed bits associated with the programming operation. Failed bits may be those bits that fail to maintain the value intended during the programming described in connection with reference number 206.

As shown by reference number 210, the storage device may evaluate whether a program voltage is successful. For example, the storage device (e.g., at the storage medium or otherwise) may measure actual voltages or charge levels in cells that were programmed in associated with reference number 206 and determine whether programmed data has errors, or data can be read without error correction, among other examples. In this way, the storage device may determine whether to re-write the data or move on to another operation.

As shown by reference number 212, if the PV is successful, the storage device may consider the program operation as a success. The storage device may maintain the APV and the PVV based on the success of the PV.

As shown by reference number 214, if the PV is unsuccessful, the storage device may evaluate whether an adjustment process loop of the APV has reached a threshold number of iterations. For example, the threshold number of iterations may reduce a likelihood of the storage device violating a quality of service (QOS) threshold, such as a latency threshold.

As shown by reference number 216, if the APV has reached the threshold number of iterations, the storage device may consider the program operation a failure. In some aspects (e.g., if this happens during a host write), the storage device may report to the host device that the program operation has failed. In some aspects, the storage device may mark one or more blocks associated with the program operation as inoperable or for garbage collection.

As shown by reference number 218, if the APV adjustment process loop has not reached the threshold number of iterations, the storage device may adjust the APV. For example, the storage device may add or subtract a value from the current APV for a subsequent iteration where the program operation is attempted again. In some aspects, the storage device may "shift" the APV in a positive or negative direction to improve a likelihood of PV success in the subsequent iteration. In some aspects, the storage device may increment a process loop counter based at least in part on adjusting the adjusted program voltage.

The APV of a current iteration may be recorded in a VB information entry maintained per VB in an information table. In this way, the storage device may apply the current APV to subsequent data writes on the same page in the target LUN of the same physical block of the VB. This may reduce program time during future data write on the same physical block.

If the data is moved to a new block due to priority garbage collection owing to uncorrectable read error on the location which cannot be recovered through a heroic recovery mechanism, the storage device may not mark the erroneous multi-plane block as bad blocks, and instead reuse the erroneous physical block through PVV and PV step size adjustment, thereby conserving effective OP of the storage device.

Based at least in part on using adaptive PVV and APV adjustments, the storage device may reduce further read errors on the same location, thereby reducing an UBER rate (e.g., associated with an SSD of the storage device) and improving reliability. By reducing uncorrectable read errors, the storage device may also avoid marking associated multi-plane blocks as bad blocks in the case of uncorrectable read errors. This may conserve effective OP, thereby reducing write amplification of the drive and reducing a reduction of storage capacity. Additionally, or alternatively, this may improve write performance, conserve PE cycles of the blocks and enhance a lifetime of the storage device.

The number and arrangement of components shown in FIG. 2 are provided as an example.

Figure 3:
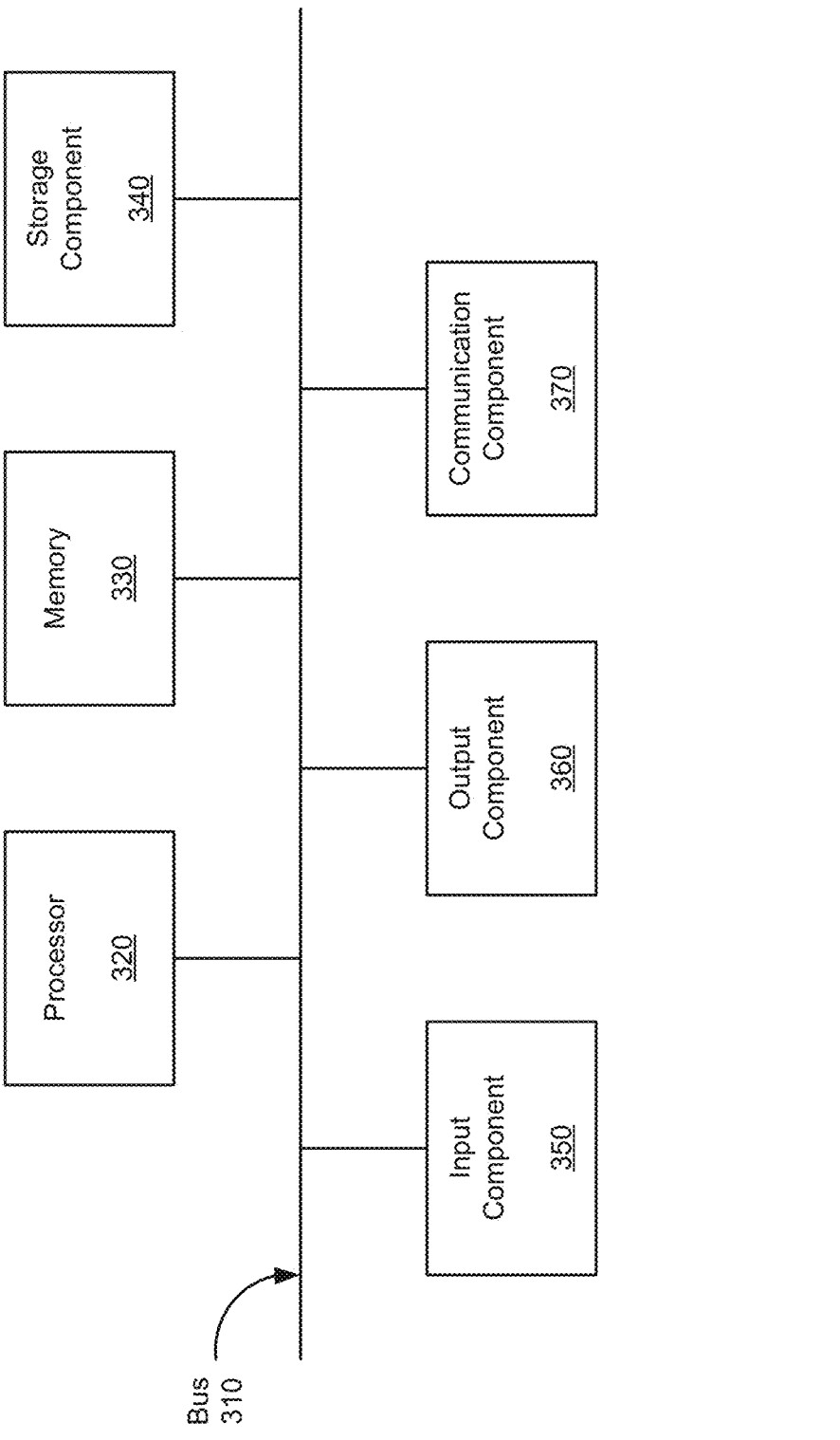
FIGS. 3-4 are diagrams of example components of one or more devices of FIG. 1.

FIG. 3 is a diagram of example components of a device 300, which may correspond to one or more devices of FIG. 1 or 2, such as a controller or a host device. In some implementations, the controller or the host device may include one or more devices 300 and one or more components of device 300. As shown in FIG. 3, device 300 may include a bus 310, a processor 320, a memory 330, a storage component 340, an input component 350, an output component 360, and a communication component 370.

Bus 310 includes a component that enables wired or wireless communication among the components of device 300. Processor 320 includes a central processing unit, a graphics processing unit, a microprocessor, a controller, a microcontroller, a digital signal processor, a field-programmable gate array, an application-specific integrated circuit, or another type of processing component. Processor 320 is implemented in hardware, firmware, or a combination of hardware and software. In some implementations, processor 320 includes one or more processors capable of being programmed to perform a function. Memory 330 includes a random access memory, a read only memory, or another type of memory (e.g., a flash memory, a magnetic memory, or an optical memory).

Storage component 340 stores information or software related to the operation of device 300. For example, storage component 340 may include a hard disk drive, a magnetic disk drive, an optical disk drive, a solid state disk drive, a compact disc, a digital versatile disc, or another type of non-transitory computer-readable medium. Input component 350 enables device 300 to receive input, such as user input or sensed inputs. For example, input component 350 may include a touch screen, a keyboard, a keypad, a mouse, a button, a microphone, a switch, a sensor, a global positioning system component, an accelerometer, a gyroscope, or an actuator. Output component 360 enables device 300 to provide output, such as via a display, a speaker, or one or more light-emitting diodes. Communication component 370 enables device 300 to communicate with other devices, such as via a wired connection or a wireless connection. For example, communication component 370 may include a receiver, a transmitter, a transceiver, a modem, a network interface card, or an antenna.

Device 300 may perform one or more processes described herein. For example, a non-transitory computer-readable medium (e.g., memory 330 or storage component 340) may store a set of instructions (e.g., one or more instructions, code, software code, or program code) for execution by processor 320. Processor 320 may execute the set of instructions to perform one or more processes described herein. In some implementations, execution of the set of instructions, by one or more processors 320, causes the one or more processors 320 or the device 300 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
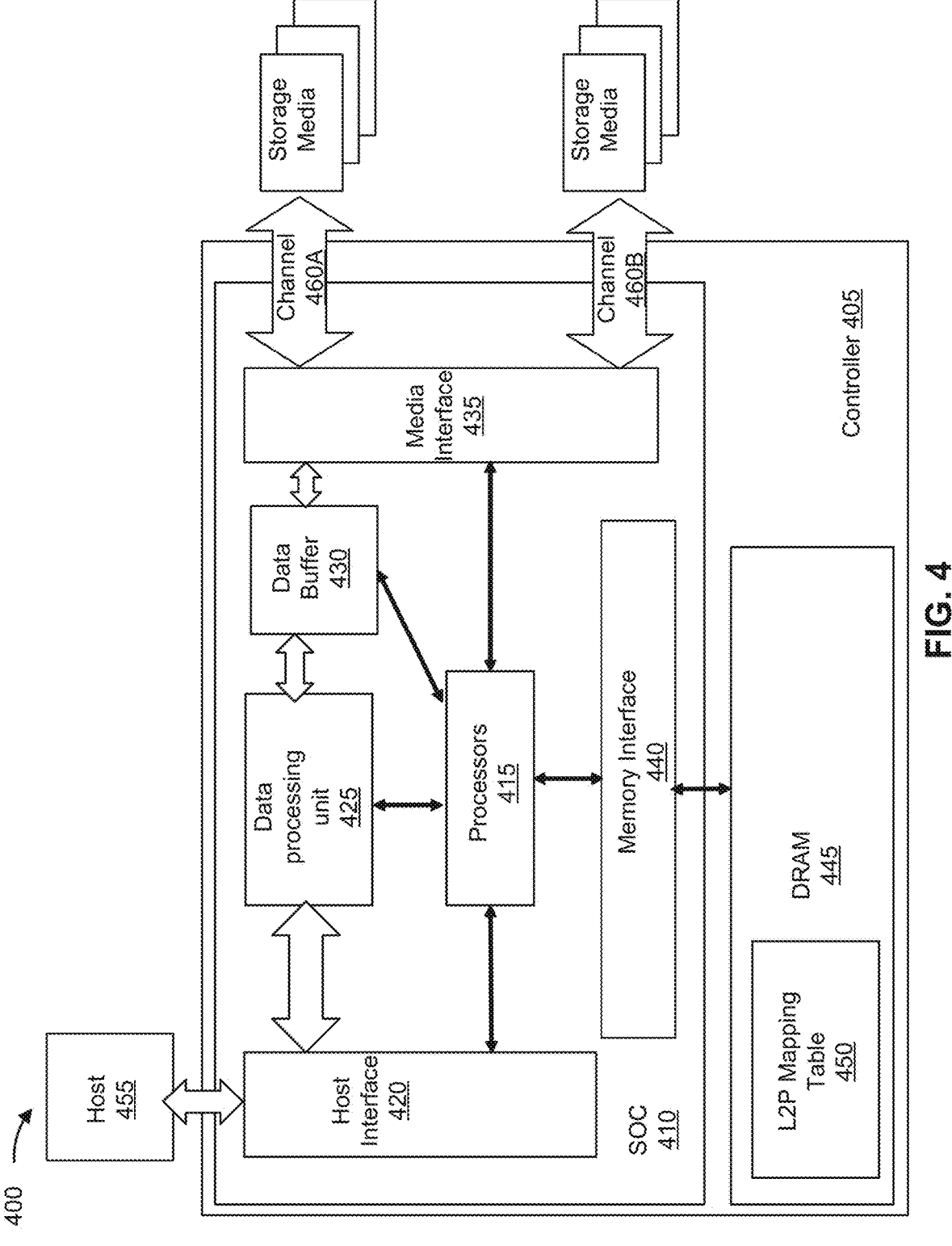

FIG. 4 is a diagram of example components of a storage device 400, which may correspond to one or more devices of FIG. 1, FIG. 2 or FIG. 3.

As shown in FIG. 4, the storage device 400 may include a controller 405 (e.g., an SSD controller). The controller 405 may include a system on chip (SOC) 410. The SOC 410 may perform computing or processing operations for the controller 405.

The SOC 410 may include one or more processors 415 that control, command, or observe operations at one or more other components of the SOC 410. The one or more processors 415 may be communicably coupled too one or more of a host interface 420, a data processing unit 425, a data buffer 430 a storage medium interface 435, or a memory interface 440.

The host interface 410 may be configured to communicate with a host device (e.g., host device 455 described below). The DPU 425 may manage data flow between the host interface 410 and storage media. The DPU 425 may further include a functional block that is responsible for managing data operations, such as reading, writing, error correction, or formatting. The DPU 425 may perform tasks such as page and block management (e.g., organization of data within storage media), bad block management, garbage collection, error correction and detection (e.g., using error correction codes or soft bit processing), data transformation (e.g., address mapping from host addresses to physical addresses, compression and decompression, or scrambling, among other examples), encryption and decryption, or power management associated with data operations, among other examples.

The data buffer 430 is a pipeline data buffer for the data transition. The data buffer 430 may include a temporary storage area used to transfer or process data between the storage media and a host system. The memory interface 440 is an interface between controller 410 and external DDR or DRAM, which may be used to temporarily hold the data. The memory interface 440 may provide an interface between the SOC 410 and the DRAM 445 to facilitate transfers of information. For example, the memory interface 440 may support requests to access a logical to physical (L2P) mapping table to identify a physical location of data requested by the host device, or to provide mapping information for storage in the L2P mapping table.

The controller 405 may further include DRAM 445. The DRAM 445 may locally store information that is available on demand at the controller 405 for operations of the controller 405. For example, the DRAM 445 may store an L2P mapping table 450 that maps logical locations of data and physical locations of data on connected storage media. In this way, the controller 405 may have access to mapping information for locating data on the connected storage media based at least in part on an indication associated with host data when written.

The host interface 420 may provide an interface for communicating with a host 455. For example, the host interface 420 may receive an access request or data for storage on connected storage media. In some aspects, the host interface 420 may provide data to the host after reading the data on from the connected storage media.

The storage media interface 435 may communicate via one or more channels 460 (e.g., 460A and 460B) with one or more connected storage media 465 (e.g., 465A and 465B). For example, the controller 405 may perform or initiate a read or write operation at a physical location of a storage media device 465.

Device 400 may perform one or more processes described herein. For example, a non-transitory computer-readable medium (e.g., memory 445 or storage component 465) may store a set of instructions (e.g., one or more instructions, code, software code, or program code) for execution by processor 415. Processor 415 may execute the set of instructions to perform one or more processes described herein. In some implementations, execution of the set of instructions, by one or more processors 415, causes the one or more processors 415 or the device 400 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 4 are provided as an example.

Figure 5:
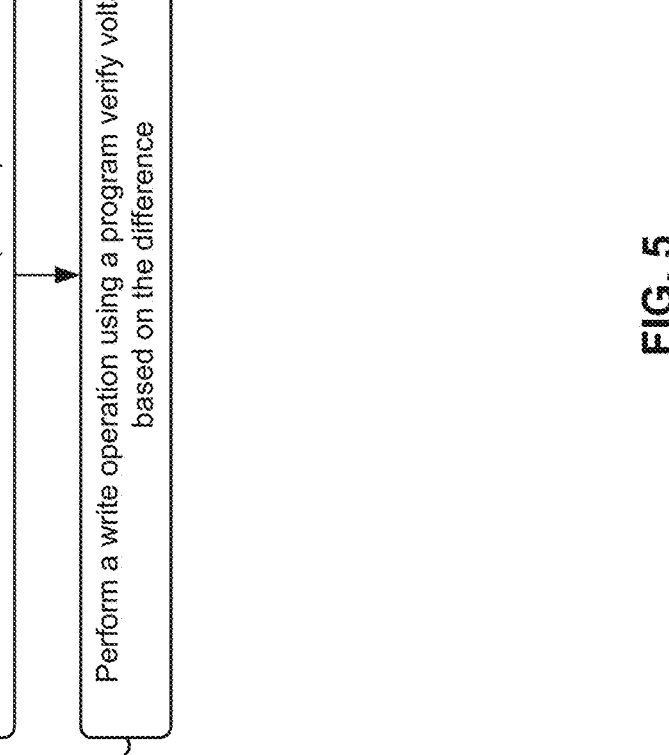

FIG. 5 is a flowchart of an example process 500 associated with adjusted programming associated with read errors field brief description of the drawings. In some implementations, one or more process blocks of FIG. 5 may be performed by a storage device (e.g., a controller or storage media of the storage device). In some implementations, one or more process blocks of FIG. 5 may be performed by another device or a group of devices separate from or including the storage device, such as a controller. Additionally, or alternatively, one or more process blocks of FIG. 5 may be performed by one or more components of device 300, such as processor 320, memory 330, storage component 340, input component 350, output component 360, or communication component 370. Additionally, or alternatively, one or more process blocks of FIG. 5 may be performed by one or more components of storage device 400, such as SOC 410, processors 415, media interface 435, or DRAM 445, among other examples.

As shown in FIG. 5, process 500 may include performing a read operation using a first read voltage (block 510). For example, the storage device may perform a read operation using a first read voltage, as described above (e.g., in connection with reference number 108).

As further shown in FIG. 5, process 500 may include identifying a read error associated with the read operation (block 520). For example, the storage device may identify a read error associated with the read operation, as described above (e.g., in connection with reference number 110).

As further shown in FIG. 5, process 500 may include identifying a difference between the first read voltage and a second read voltage, the second read voltage associated with a reduced RBER (block 530). For example, the storage device may identify a difference between the first read voltage and a second read voltage, the second read voltage associated with a reduced RBER, as described above (e.g., in connection with reference number 114).

As further shown in FIG. 5, process 500 may include performing a write operation using a program verify voltage that is based on the difference (block 540). For example, the storage device may perform a write operation using a program verify voltage that is based on the difference, as described above (e.g., in connection with reference number 120).

Process 500 may include additional implementations, such as any single implementation or any combination of implementations described below and/or in connection with one or more other processes described elsewhere herein.

In a first implementation, a difference between the first read voltage and the second read voltage comprises an amount of a shift and a direction of the shift.

In a second implementation, alone or in combination with the first implementation, process 500 includes identifying, based at least in part on performing error correction associated with the read error, the second read voltage associated with a reduced RBER.

In a third implementation, alone or in combination with one or more of the first and second implementations, process 500 includes moving data associated with the read operation to a new block associated with a different physical location of the storage device.

In a fourth implementation, alone or in combination with one or more of the first through third implementations, process 500 includes storing, in metadata of a virtual block associated with the read operation, an indication of the difference.

In a fifth implementation, alone or in combination with one or more of the first through fourth implementations, process 500 includes adjusting a program voltage based on the program verify voltage.

In a sixth implementation, alone or in combination with one or more of the first through fifth implementations, process 500 includes applying the program voltage, after the adjusting, to a virtual block associated with the read operation, or applying the program voltage, after the adjusting, to one or more physical blocks associated with the virtual block.

In a seventh implementation, alone or in combination with one or more of the first through sixth implementations, performing the write operation using the program verify voltage that is based on the difference includes using the program verify voltage during the write operation based on the write operation being associated with a same page type of a same LUN of a same virtual block as the read operation. A page type may include a lower page, a middle page, or an upper page of a word line, among other examples.

In an eighth implementation, alone or in combination with one or more of the first through seventh implementations, the read operation is associated with a page type and a LUN of a virtual block, and wherein the write operation is associated with the page type and the LUN.

In a ninth implementation, alone or in combination with one or more of the first through eighth implementations, the read operation is associated with a page type and a LUN of a virtual block, and wherein the program verify voltage is applied to the page type and the LUN for one or more subsequent program operations.

In a tenth implementation, alone or in combination with one or more of the first through ninth implementations, the program verify voltage is offset from a default program verify voltage.

In an eleventh implementation, alone or in combination with one or more of the first through tenth implementations, process 500 includes adjusting a program step voltage based at least in part on the program verify voltage.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with adjusted programming associated with read errors field brief description of the drawings. In some implementations, one or more process blocks of FIG. 6 may be performed by a storage device (e.g., a controller or storage media of the storage device). In some implementations, one or more process blocks of FIG. 6 may be performed by another device or a group of devices separate from or including the storage device, such as a controller. Additionally, or alternatively, one or more process blocks of FIG. 6 may be performed by one or more components of device 300, such as processor 320, memory 330, storage component 340, input component 350, output component 360, or communication component 370. Additionally, or alternatively, one or more process blocks of FIG. 6 may be performed by one or more components of storage device 400, such as SOC 410, processors 415, media interface 435, or DRAM 445, among other examples.

As shown in FIG. 6, process 600 may include performing a read operation using a first read voltage (block 610). For example, the storage device may perform a read operation using a first read voltage, as described above (e.g., in connection with reference number 108).

As further shown in FIG. 6, process 600 may include identifying a read error associated with the read operation (block 620). For example, the storage device may identify a read error associated with the read operation, as described above (e.g., in connection with reference number 110).

As further shown in FIG. 6, process 600 may include identifying a difference between the first read voltage and a second read voltage, the second read voltage associated with a reduced RBER (block 630). For example, the storage device may identify a difference between the first read voltage and a second read voltage, the second read voltage associated with a reduced RBER, as described above (e.g., in connection with reference number 114).

As further shown in FIG. 6, process 600 may include adjusting a program verify voltage based at least in part on the difference (block 640). For example, the storage device may adjust a program verify voltage based at least in part on the difference, as described above (e.g., in connection with reference number 122).

As further shown in FIG. 6, process 600 may include performing a write operation using the program verify voltage that is based at least in part on the difference (block 650). For example, the storage device may perform a write operation using the program verify voltage that is based at least in part on the difference, as described above (e.g., in connection with reference number 120).

Process 600 may include additional implementations, such as any single implementation or any combination of implementations described below and/or in connection with one or more other processes described elsewhere herein.

In a first implementation, the difference comprises an amount of a shift and a direction of the shift from the first read voltage to the second read voltage.

In a second implementation, alone or in combination with the first implementation, process 600 includes identifying, based at least in part on performing error correction associated with the read operation, the second read voltage associated with the reduced RBER.

In a third implementation, alone or in combination with one or more of the first and second implementations, process 600 includes storing an indication of the difference in metadata of a virtual block associated with the read operation.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process 700 associated with adjusted programming associated with read errors field brief description of the drawings. In some implementations, one or more process blocks of FIG. 7 may be performed by a storage device (e.g., a controller or storage media of the storage device). In some implementations, one or more process blocks of FIG. 7 may be performed by another device or a group of devices separate from or including the storage device, such as a controller. Additionally, or alternatively, one or more process blocks of FIG. 7 may be performed by one or more components of device 300, such as processor 320, memory 330, storage component 340, input component 350, output component 360, or communication component 370. Additionally, or alternatively, one or more process blocks of FIG. 7 may be performed by one or more components of storage device 400, such as SOC 410, processors 415, media interface 435, or DRAM 445, among other examples.

As shown in FIG. 7, process 700 may include performing a read operation using a first read voltage (block 710). For example, the storage device may perform a read operation using a first read voltage, as described above (e.g., in connection with reference number 108).

As further shown in FIG. 7, process 700 may include identifying a read error associated with the read operation (block 720). For example, the storage device may identify a read error associated with the read operation, as described above (e.g., in connection with reference number 110).

As further shown in FIG. 7, process 700 may include performing the read operation using a second read voltage with a difference from the first read voltage, the difference having an amount and direction of a shift from the first read voltage (block 730). For example, the storage device may perform the read operation using a second read voltage with a difference from the first read voltage, the difference having an amount and direction of a shift from the first read voltage, as described above (e.g., in connection with reference number 114).

As further shown in FIG. 7, process 700 may include identifying a difference between the first read voltage and a second read voltage, the second read voltage associated with a reduced RBER (block 740). For example, the storage device may identify a difference between the first read voltage and a second read voltage, the second read voltage associated with a reduced RBER, as described above (e.g., in connection with reference number 114).

As further shown in FIG. 7, process 700 may include performing a write operation using a program verify voltage that is based on the difference (block 750). For example, the storage device may perform a write operation using a program verify voltage that is based on the difference, as described above (e.g., in connection with reference number 120).

Process 700 may include additional implementations, such as any single implementation or any combination of implementations described below and/or in connection with one or more other processes described elsewhere herein.

In a first implementation, process 700 includes storing an indication of the difference in metadata of a virtual block associated with the read operation.

In a second implementation, alone or in combination with the first implementation, the read operation is associated with a page and a LUN of a virtual block, and wherein the write operation is associated with the page type and the LUN.

In a third implementation, alone or in combination with one or more of the first and second implementations, the program verify voltage is offset from a default program verify voltage.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

As used herein, the term "component" is intended to be broadly construed as hardware, firmware, or a combination of hardware and software. It will be apparent that systems or methods described herein may be implemented in different forms of hardware, firmware, or a combination of hardware and software. The actual control hardware or software code used to implement these systems or methods is not limiting of the implementations. Thus, the operation and behavior of the systems or methods are described herein without reference to specific software code-it being understood that software and hardware can be used to implement the systems or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Although particular combinations of features are recited in the claims or disclosed in the specification, these combinations are not intended to limit the disclosure of various implementations. In fact, many of these features may be combined in ways not specifically recited in the claims or disclosed in the specification. Although each dependent claim listed below may directly depend on only one claim, the disclosure of various implementations includes each dependent claim in combination with other claims in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein is to be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "or," unless explicitly stated otherwise (e.g., if used in combination with "either" or "only one of").

What is claimed is:

1. A method performed by a storage device, the method comprising:
performing a read operation using a first read voltage;
identifying a read error associated with the read operation;
identifying a difference between the first read voltage and a second read voltage, the second read voltage associated with a reduced raw bit error rate (RBER); and
performing a write operation using a program verify voltage that is based on the difference.

2. The method of claim 1, wherein the difference between the first read voltage and the second read voltage comprises an amount of a shift and a direction of the shift.

3. The method of claim 1, comprising:
identifying, based at least in part on performing error correction associated with the read error, the second read voltage associated with the reduced raw bit error rate (RBER).

4. The method of claim 1, comprising:
moving data associated with the read operation to a new block associated with a different physical location of the storage device.

5. The method of claim 1, comprising:
storing, in metadata of a virtual block associated with the read operation, an indication of the difference.

6. The method of claim 1, comprising:
adjusting a program voltage based on the program verify voltage.

7. The method of claim 6, comprising:
applying the program voltage, after the adjusting, to a virtual block associated with the read operation, or applying the program voltage, after the adjusting, to one or more physical blocks associated with the virtual block.

8. The method of claim 1, wherein performing the write operation using the program verify voltage that is based on the difference comprises:
using the program verify voltage during the write operation based on the write operation being associated with a same page type of a same logical unit number (LUN) of a same virtual block as the read operation.

9. The method of claim 1, wherein the read operation is associated with a page type and a logical unit number (LUN) of a virtual block, and
wherein the write operation is associated with the page type and the LUN.

10. The method of claim 1, wherein the read operation is associated with a page type and a logical unit number (LUN) of a virtual block, and
wherein the program verify voltage is applied to the page type and the LUN for one or more subsequent program operations.

11. The method of claim 1, wherein the program verify voltage is offset from a default program verify voltage.

12. The method of claim 1, comprising:
adjusting a program step voltage based at least in part on the program verify voltage.

13. A system comprising:
a controller, of a non-volatile memory device, to:
perform a read operation using a first read voltage;
identify a read error associated with the read operation;
identify a difference between the first read voltage and a second read voltage, the second read voltage associated with a reduced raw bit error rate (RBER);
adjust a program verify voltage based at least in part on the difference; and
perform a write operation using the program verify voltage that is based at least in part on the difference.

14. The system of claim 13, wherein the difference comprises an amount of a shift and a direction of the shift from the first read voltage to the second read voltage.

15. The system of claim 13, wherein the controller is to:
identify, based at least in part on performing error correction associated with the read operation, the second read voltage associated with the reduced RBER.

16. The system of claim 13, wherein the controller is to:
store an indication of the difference in metadata of a virtual block associated with the read operation.

17. A computer program product comprising:
one or more non-transitory computer readable storage media, and program instructions collectively stored on the one or more non-transitory computer readable storage media, the program instructions comprising:
program instructions to perform a read operation using a first read voltage;
program instructions to identify a read error associated with the read operation;
program instructions to perform the read operation using a second read voltage different than the first read voltage;
program instructions to identify a difference between the first read voltage and the second read voltage, the second read voltage being associated with a reduced raw bit error rate (RBER), wherein the difference comprises an amount of a shift from the first read voltage to the second read voltage and a direction of the shift from the first read voltage to the second read voltage; and program instructions to perform a write operation using a program verify voltage that is based on the difference.

18. The computer program product of claim 17, wherein the program instructions comprise:

program instructions to store an indication of the difference in metadata of a virtual block associated with the read operation.

19. The computer program product of claim 17, wherein the read operation is associated with a page type and a logical unit number (LUN) of a virtual block, and wherein the write operation is associated with the page type and the LUN.

20. The computer program product of claim 17, wherein the program verify voltage is offset from a default program verify voltage.

* * * * *